US011766787B2

(12) United States Patent
Norboe

(10) Patent No.: US 11,766,787 B2
(45) Date of Patent: Sep. 26, 2023

(54) MULTI-PATH COOLING FOR ROBOTIC SYSTEMS

(71) Applicant: OMRON Corporation, Kyoto (JP)

(72) Inventor: Daniel P. Norboe, Alameda, CA (US)

(73) Assignee: OMRON CORPORATION, Kyoto (JP)

( * ) Notice: Subject to any disclaimer, the term of this patent is extended or adjusted under 35 U.S.C. 154(b) by 78 days.

(21) Appl. No.: 17/435,799

(22) PCT Filed: Feb. 28, 2020

(86) PCT No.: PCT/US2020/020373
§ 371 (c)(1),
(2) Date: Sep. 2, 2021

(87) PCT Pub. No.: WO2020/180676
PCT Pub. Date: Sep. 10, 2020

(65) Prior Publication Data
US 2022/0143848 A1    May 12, 2022

Related U.S. Application Data

(60) Provisional application No. 62/813,505, filed on Mar. 4, 2019.

(51) Int. Cl.
*B25J 19/00*     (2006.01)
*B25J 9/04*      (2006.01)
*H05K 7/20*      (2006.01)

(52) U.S. Cl.
CPC .......... *B25J 19/0054* (2013.01); *B25J 9/042* (2013.01); *H05K 7/20409* (2013.01)

(58) Field of Classification Search
CPC .................... H05K 7/20409–20418; H05K 7/20436–20454; H05K 7/20509; B25J 19/0054; B25J 9/042; B25J 9/044
See application file for complete search history.

(56) References Cited

U.S. PATENT DOCUMENTS 6,831,436 B2 * 12/2004 Gonzalez ................. B25J 9/041
                                                  318/567
8,222,541 B2 *  7/2012 Vander Ploeg .... H05K 7/20545
                                                  174/382

(Continued)

FOREIGN PATENT DOCUMENTS

CN      109773753 A    5/2019
JP      2003-163477 A  6/2003

(Continued)

OTHER PUBLICATIONS

Supplementary European Search Report for European Application No. EP 20 76 6797 dated Oct. 31, 2022.

(Continued)

*Primary Examiner* — Zachary Pape
(74) *Attorney, Agent, or Firm* — Knobbe Martens Olson & Bear LLP

(57) ABSTRACT

This application describes multi-path cooling arrangements for robotic systems. For example, a robotic system can include a heat generating component positioned within a base that supports one or more articulating links. The heat generating component can be supported on a thermally conductive bracket within the base. The robotic system can include a first thermally conductive path configured to dissipate heat from the heat generating component. The first thermally conductive path can include the bracket and a first heatsink connected to the bracket. The robotic system can also include a second thermally conductive path configured to dissipate heat from the heat generating component. The second thermally conductive path can include the bracket, a thermal pad positioned on the bracket, and a second heatsink positioned on a second side of the base.

18 Claims, 6 Drawing Sheets

(56) References Cited

U.S. PATENT DOCUMENTS

| | | | |
|---|---|---|---|
| 9,431,881 B2 | 8/2016 | Clendenen et al. | |
| 10,070,562 B2* | 9/2018 | Lassini | H05K 7/20854 |
| 10,667,429 B2* | 5/2020 | Chauhan | H01L 23/36 |
| 10,953,537 B2* | 3/2021 | Niu | B25J 9/12 |
| 11,154,984 B2* | 10/2021 | Huang | B25J 9/126 |
| 2005/0087034 A1 | 4/2005 | Friedrich et al. | |
| 2014/0060231 A1* | 3/2014 | Watanabe | B25J 19/0054 74/490.03 |
| 2014/0076642 A1 | 3/2014 | Gettings et al. | |
| 2014/0265748 A1 | 9/2014 | Clendenen et al. | |
| 2015/0336264 A1 | 11/2015 | Berger et al. | |
| 2017/0203445 A1* | 7/2017 | Owa | B25J 19/0054 |
| 2017/0341223 A1 | 11/2017 | Hahakura et al. | |
| 2019/0061178 A1 | 2/2019 | Chikara et al. | |
| 2021/0245372 A1* | 8/2021 | Hosek | B25J 19/0045 |

FOREIGN PATENT DOCUMENTS

| | | | |
|---|---|---|---|
| JP | 2017-127914 A | 7/2017 | |
| JP | 2017-216863 A | 12/2017 | |

OTHER PUBLICATIONS

Notice of Reasons for Refusal for Japanese Patent Application No. 2021-549664 dated Sep. 28, 2022.
Adept Technology, In. Adept eCobra 600/800 Robot. User's Guide. Mar. 2015.
Search Report and Written Opinion received in International Application No. PCT/US2020/020373 dated Jun. 18, 2020.

* cited by examiner

MULTI-PATH COOLING FOR ROBOTIC SYSTEMS

CROSS-REFERENCE TO RELATED APPLICATION(S)

This application claims the benefit of U.S. Provisional Application No. 62/813,505, filed Mar. 4, 2019, which is hereby incorporated by reference in its entirety.

BACKGROUND

Field

This application relates to robotic systems, and in particular, to multi-path cooling for robotic arms, as well as related systems and methods.

Description

Robotic systems, including robotic arms, may be used to perform various tasks, and are particularly common in automation. Robotic arms typically comprise a plurality of links connected by one or more joints. The one or more joints are driven by various types of actuators (e.g., electric motors, hydraulics, etc.) to control articulation of the robotic arm to position an end effector that is configured to perform a task.

Robotic systems often include heat generating components. For example, electrical components associated with driving the actuators of the robotic arm and various controllers of the robotic systems (e.g., processor boards for the robotic arm(s)) or other components can generate heat. Managing the heat generated by these components to adequately provide cooling for robotic systems may pose challenges in some instances.

SUMMARY

This application describes multi-path cooling systems and methods for robotic arms. The multi-path cooling arrangements described herein can be configured to dissipate heat from heat generating components positioned within a base of a robotic arm. The heat generating components can be mounted on a thermally conductive bracket. A first portion of the bracket can be attached to a first portion of the base to form a first thermally conductive path for dissipating heat from the heat generating components. The first thermally conductive path can conduct heat from the heat generating component, through the bracket, to the first portion of the base. The first portion of the base can include a first heatsink. A second portion of the bracket can be in contact with a second portion of the base, for example, through a thermal pad, to form a second thermally conductive path. The second thermally conductive path can conduct heat from the heat generating component, through the bracket and the thermal pad, to the second portion of the base. The second portion of the base can include a second heatsink.

In one example described herein, a robotic system is disclosed. The robotic system includes a base supporting one or more articulating links. The base includes a front portion comprising a front wall and a rear portion removably attached to the front portion and comprising a back wall. The base also includes a bracket supporting a heat generating component. A first side of the bracket is attached to the back wall of the rear portion of the base to form a first thermally conductive path that, in use, dissipates heat from the heat generating component. The base also includes a thermal pad attached to a second side of the bracket. The thermal pad contacts the front wall of the base to form a second thermally conductive path that, in use, dissipates heat from the heat generating component.

In some embodiments, the robotic system can include one or more of the following features in any combination: (a) wherein the rear portion is removably connected to the front portion; (b) wherein the heat generating component comprises an amplifier; (c) wherein the amplifier is mounted on the bracket such that a longitudinal axis of the amplifier extends in a substantially horizontal direction; (d) wherein the front wall of the front portion comprises one or more fins configured to dissipate heat; (e) wherein the back wall of the rear portion comprises one or more fins configured to dissipate heat; (f) wherein the bracket comprises a first flange connected to the back wall of the rear portion, wherein the thermal pad is positioned on an outer surface of the first flange so as to contact the front wall of the front portion, a second flange, and a plate extending between the first flange and the second flange, wherein the heat generating component is mounted to the plate; (g) wherein the first flange and the second flange extend in a substantially vertical direction, and the plate extends in a substantially horizontal direction; (h) wherein the base is substantially watertight; and/or (i) wherein an integrated controller is positioned within the base, and wherein the integrated controller comprises the heat generating component.

In one example described herein, a robotic system is disclosed. The robotic system includes a heat generating component positioned within a base that supports one or more articulating links. The robotic system includes a bracket supporting the heat generating component, wherein the heat generating component is mounted on and directly contacts the bracket, and wherein the bracket is thermally conductive. The robotic system includes a first thermally conductive path configured to dissipate heat from the heat generating component. The first thermally conductive path comprises the bracket and a first heatsink connected to the bracket. The first heatsink is positioned on a first side of the base. The robotic system includes a second thermally conductive path configured to dissipate heat from the heat generating component. The second thermally conductive path comprises the bracket, a thermal pad positioned on the bracket, and a second heatsink positioned on a second side of the base. The thermal pad physically contacts the second heatsink.

In some embodiments, the robotic system can include one or more of the following features in any combination: (a) wherein the heat generating component comprises an amplifier; (b) wherein the amplifier is mounted on the bracket such that a longitudinal axis of the amplifier extends in a horizontal direction; (c) wherein the first heatsink is disposed on a first wall of the base, and the second heatsink is disposed on a second wall of the base, wherein the first and second wall are positioned on substantially opposite sides of the base; (d) wherein the bracket comprises a first flange connected to the first heatsink, a second flange, wherein the thermal pad is positioned on an outer surface of the first flange so as to contact the second heatsink, and a plate extending between the first flange and the second flange, wherein the heat generating component is mounted to the plate; and/or (e) wherein the first flange and the second flange extend in a substantially vertical direction, and the plate extends in a substantially horizontal direction.

In another example described herein, a method for dissipating heat in a robotic system is disclosed. The method includes mounting a heat generating component on a bracket within a base of a robotic arm, the bracket being thermally conductive; attaching the bracket to a first heatsink positioned on a first side of the base to form a first thermally conductive path configured to dissipate heat from the heat generating component; and contacting a thermal pad positioned on the bracket to a second heatsink positioned on a second side of the base to form a second thermally conductive path configured to dissipate heat from the heat generating component.

In some embodiments, the method can include one or more of the following features in any combination: (a) wherein contacting the thermal pad comprises attaching a rear portion of the housing to a front portion of the housing, wherein the first heatsink is disposed on the rear portion of the housing and the bracket is connected to the rear portion of the housing, and wherein the second heatsink is disposed on the front portion of the housing; (b) wherein the heat generating component comprises an amplifier, and wherein mounting the heat generating component on the bracket comprises mounting the amplifier on the bracket such that a longitudinal axis of the amplifier extends in a generally horizontal direction; (c) wherein the first heatsink comprises one of more fins formed on the first side of the base; and/or (d) wherein the second heatsink comprises one of more fins formed on the second side of the base.

The examples and features described in this section are intended only as a summary of the invention and should not be construed as limiting. Additional examples and features are described in more detail below.

BRIEF DESCRIPTION OF THE DRAWINGS

The features and advantages of the multi-path cooling arrangements for robotic systems, as well as related systems and methods, described herein will become more fully apparent from the following description and appended claims, taken in conjunction with the accompanying drawings. These drawings depict only several embodiments in accordance with the disclosure and are not to be considered limiting of its scope. In the drawings, similar reference numbers or symbols typically identify similar components, unless context dictates otherwise. The drawings may not be drawn to scale.

DETAILED DESCRIPTION

The features of the multi-path cooling arrangements for robotic systems, as well as related systems and methods, will now be described in detail with reference to certain embodiments illustrated in the figures. The illustrated embodiments described herein are provided by way of illustration and are not meant to be limiting. Other embodiments can be utilized, and other changes can be made, without departing from the spirit or scope of the subject matter presented. It will be readily understood that the aspects and features of the present disclosure described below and illustrated in the figures can be arranged, substituted, combined, and designed in a wide variety of different configurations by a person of ordinary skill in the art, all of which are made part of this disclosure.

Figure 1:
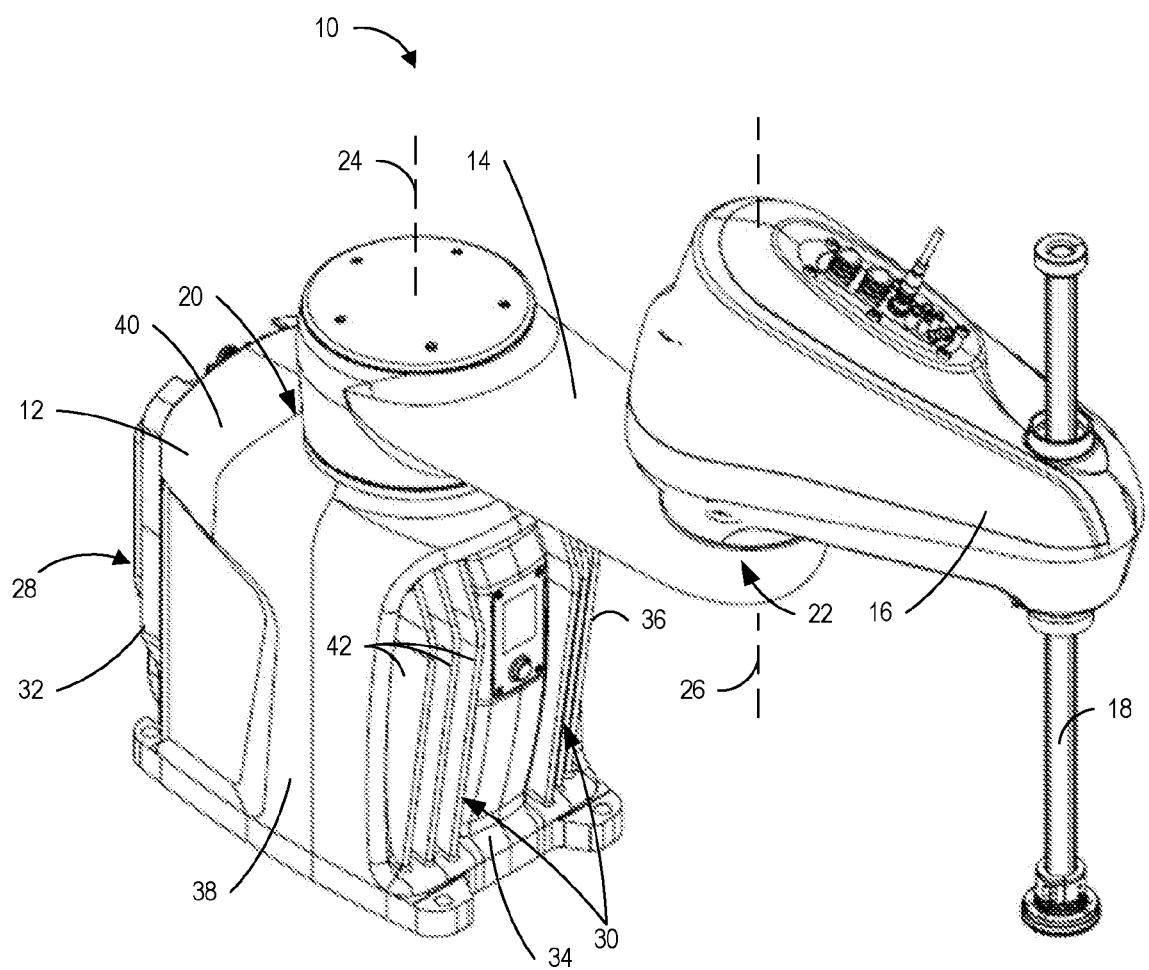
FIG. 1 is an isometric view of an embodiment of a robotic system configured as a robotic arm.
Figure 2:
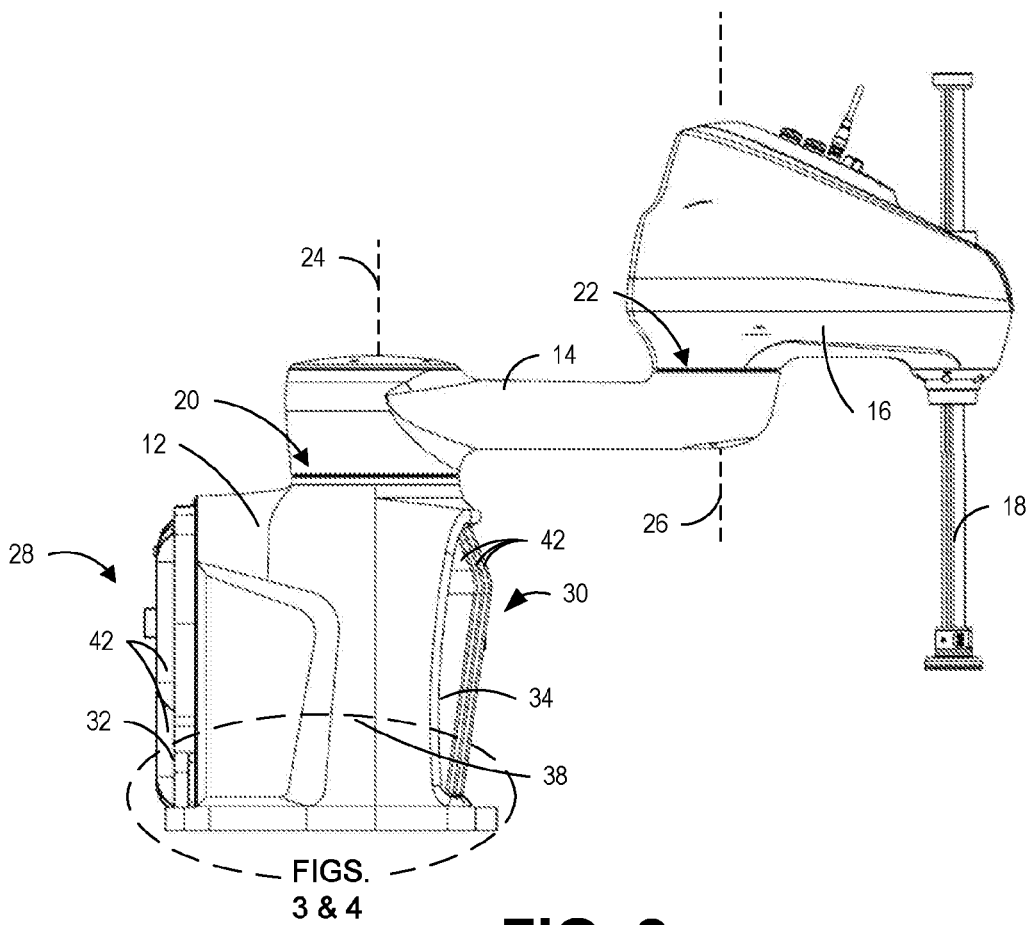
FIG. 2 is a side view of the robotic arm of FIG. 1.

FIGS. 1 and 2 are isometric and side views, respectively, of an embodiment of a robotic system 10 that can include a multi-path cooling arrangement as described herein. Example, multi-path cooling arrangements are shown, for example, in FIGS. 3-7, which are described further below. In the illustrated embodiment of FIG. 1, the robotic system 10 is configured as a robotic arm that includes a controller integrated within its base. In the illustrated embodiment, the robotic system 10 includes a base 12, a first link 14, a second link 16, and an end effector 18. The multi-path cooling arrangement described herein can also be used on other types of robotic arms and systems. The illustrated robotic system 10 is provided by way of example only.

The base 12 can be configured to support the other portions of the robotic system 10, such as the first link 14, the second link 16, and the end effector 18. As illustrated, the robotic arm is supported by and extends from the base 12. In some embodiments, the base 12 includes an integrated controller for operating the robotic arm. In the illustrated embodiment, the first link 14 is connected to the base 12 by a first rotational joint 20. The first rotational joint 20 allows the first link 14 to rotate or articulate relative to the base 12. In the illustrated embodiment, the first link 14 rotates relative to the base 12 about a first axis of rotation 24. In general, rotation of the first link 14 relative to the base 12 may be controlled through the execution of one or more sequences of instructions (i.e., software) and/or by customized hardware (e.g., application-specific integrated circuit (s), field-programmable gate array(s), etc.).

One or more motors (not illustrated) can be used to drive rotation or articulation of the first rotational joint 20. The one or more motors can be, for example, electric motors. The motors can be positioned in the base 12 and/or the first link 14. The one or more motors can be connected to one or more amplifiers 44 (see FIGS. 3 and 4) that are configured to drive the one or more motors. The amplifiers 44 can be controlled, for example, by a motor controller. As will be described more fully below, the amplifiers 44 can be positioned within the base 12. The amplifiers 44 may generate heat that may need to be dissipated for sustained use of the robotic system 10. The multi-path cooling arrangements described below can be used to dissipate the heat generated by the amplifiers 44, for example. The multi-path cooling arrangements can also be configured to dissipate heat generated by other components of the robotic system 10, such as processors positioned within the base 12, for example.

As shown in FIGS. 1 and 2, the second link 16 can be connected to the first link 14 by a second rotational joint 22. The second rotational joint 22 allows the second link 16 to rotate or articulate relative to the first link 14. In the illustrated embodiment, the second link 16 rotates relative to the first link 14 about a second axis of rotation 26. Again, in general, rotation of the second link 16 relative to the first link 14 may be controlled or limited by software or customized hardware. One or more motors (not illustrated) can be used to drive rotation or articulation of the second rotational joint 22 as described above with reference to the first rotational joint 20. Again, the one or more motors can be connected to one or more amplifiers 44, which can be positioned within the base 12. The multi-path cooling arrangements described below can be used to dissipate the heat generated by the amplifiers 44 associated with the motors of the second rotational joint 22 or other heat generating components within the base 12.

In the illustrated embodiment, the base 12, first link 14, and second link 16 are arranged to form a selective compliance assembly robot arm (SCARA). The multi-path cooling arrangements described herein may be configured for use with SCARAs and may also be configured for use with other types of robotic arms (e.g., non-SCARA) and other robotic systems.

In the illustrated embodiment of FIG. 1, the robotic system 10 includes an end effector 18. In this embodiment, the end effector 18 is positionable by rotating or articulating the first and/or second links 14, 16 about the first and/or second rotational axes 24, 26. The end effector 18 may be driven by one or more motors. The one or motors can be driven by amplifiers 44, which can be positioned within the base 12. The end effector 18 can be configured to perform various tasks as will be apparent to those of ordinary skill in the art.

The base 12 may house (e.g., partially or fully enclose) many of the electronic components of the robotic system 10. In some embodiments, the base 12 houses an integrated controller. The integrated controller may comprise one or more components configured to control or allow control of the robotic arm. In some instances, it may be advantageous to include the integrated controller within the base 12. For example, housing the integrated controller within the base 12 removes the need for a separate controller, which can simplify the robotic system 10. At the same time, integrating the controller into the base 12 adds additional components to the base 12. This causes the base 12 to be more full (less empty space) and generates more heat. The multi-path cooling arrangements described herein can address these challenges, allowing for the use of a controller integrated into the base 12, while still sufficiently managing heat.

Figure 3:
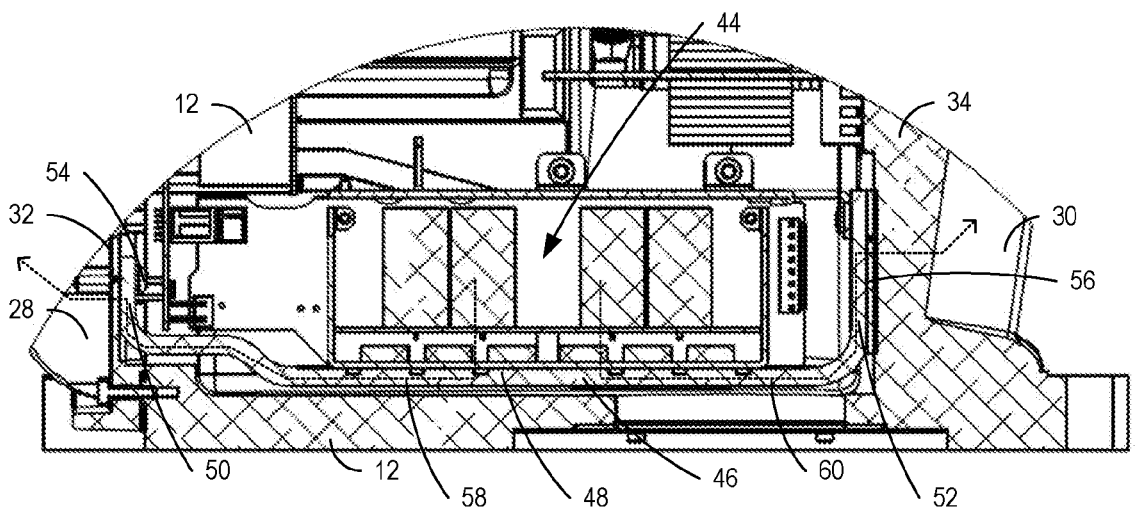
FIG. 3 is a cross-sectional view of a portion of the robotic arm of FIG. 2.
Figure 4:
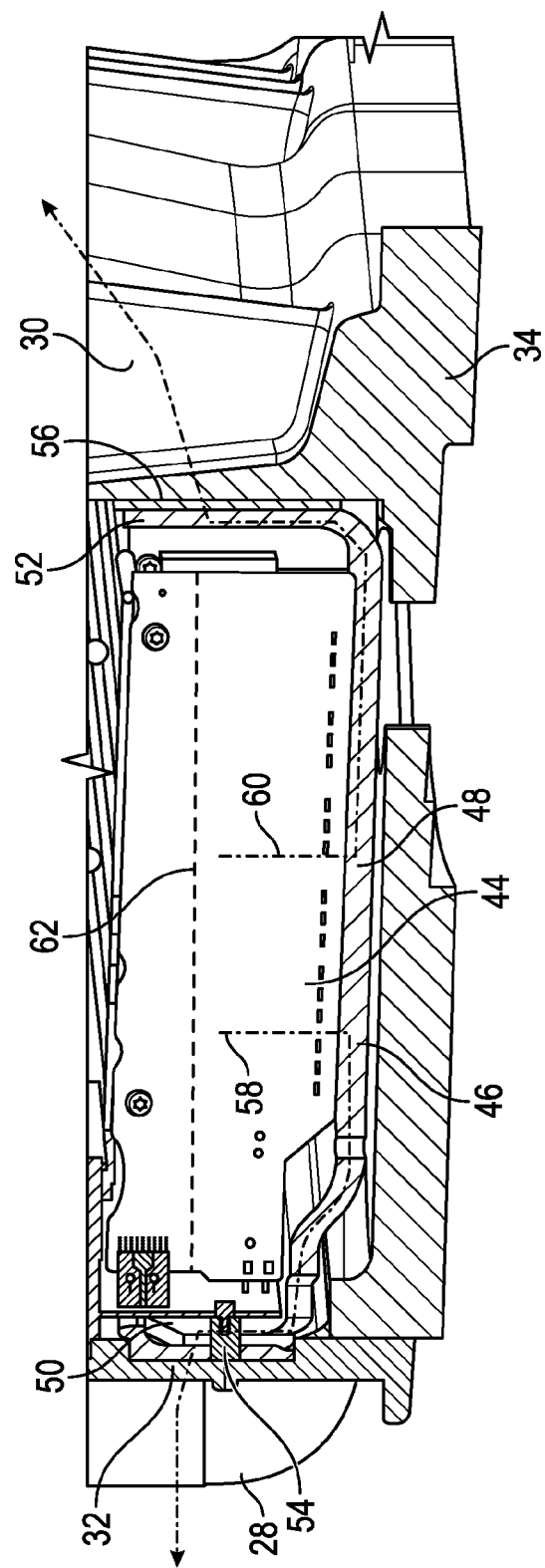
FIG. 4 is a cross-sectional perspective view of the portion of the robotic arm of FIG. 2.

In some embodiments, the controller, which may comprise one or more processor boards, is mounted directly to the rear heat sink (e.g., the first heat sink 28 or the second heat sink 30), displacing the amplifiers 44 to the position shown in FIGS. 3 and 4 (e.g., on the bracket 46). In this position, the amplifiers 44, which generate heat, are not closely positioned to a heat sink. Thus, it may be difficult to dissipate heat from the amplifiers 44. The multi-path cooling arrangements described herein can address this difficulty as discussed below. In another arrangement, the amplifiers 44 can be mounted directly to a heat sink (e.g., the first or second heat sinks 28, 30), displaying the controller to a position within the base that does not directly contact a heat sink. In this arrangement, the multi-path cooling arrangement described herein can be used to dissipate heat from the controller.

As mentioned above, the base 12 may house the integrated controller, the amplifiers 44, and motor controllers associated with motion of the first link 14, the second link 16, and the end effector 18. Other components can also be positioned within the base 12. Often, these electronic components generate heat that must be dissipated in order to prevent the robotic system 10 from overheating. In many instances, it can be beneficial to position many of these heat generating components of the robotic system 10 within the base 12 because, for example, this may produce a space-efficient design, maximize the stability of the robotic system 10, and/or simplify wiring of the robotic system 10. However, grouping heat generating components within the base 12 may pose some challenges. For example, grouping heat generating components within the base 12 may increase the total amount of heat that needs to be dissipated, while minimizing the space with which do so. Further, in some embodiments, the base 12 may be water resistant, water tight, or tightly sealed such that natural convection of heat within or from the base 12 is limited. The multi-path cooling arrangements described herein may resolve or aid in resolving these challenges.

The cooling arrangements described herein are referred to as "multi-path" because, in some embodiments, heat generated by the heat generating components has more than one path (e.g., more than one thermally conductive path) by which it can be dissipated. As shown in FIGS. 1 and 2, for example, the base 12 can include a first heatsink 28 and a second heatsink 30. A multi-path cooling arrangement can provide a first thermal path for dissipating heat to the first heatsink 28 and a second thermal path for dissipating heat to the second heatsink 30.

In the illustrated embodiment, the first heatsink 28 is positioned on a rear side or portion 32 of the base 12, and the second heatsink 30 is positioned on a front side or portion 34 of the base 12. In this example, the rear side or portion 32 is opposite the front side or portion 34. Other positions of the first heatsink 28 and the second heatsink 30 are also possible. For example, in some embodiments, the first heatsink 28 and the second heatsink 30 can be reversed such that the first heatsink 28 is positioned on the front side or portion 34 and the second heatsink 30 is positioned on the rear side or portion 32. In some embodiments, the first heatsink 28 and the second heatsink 30 can be positioned on a right side or portion 36 and a left side or portion 38, respectively (or vice versa). In some embodiments, one of the first heatsink 28 and the second heatsink 30 can be positioned on the rear side or portion 32 or the front side or portion 34 and the other of the first heatsink 28 and the second heatsink 30 can be positioned on the right side or portion 36 or the left side or portion 38. In some embodiments, both the first heatsink 28 and the second heatsink 30 can be positioned on the same side or portion. In some embodiments, one or both of the first heatsink 28 and the second heatsink 30 can be positioned on a top side or portion 40 of the base 12. Those of ordinary skill in the art will appreciate, upon consideration of this disclosure, that many possibilities exist at which the first heatsink 28 and the second heatsink 30 can be positioned.

The term "heatsink" is used broadly to denote any structure that is configured to dissipate heat. For example, in some embodiments, a heatsink comprises one or more fins 42 configured to provide surface areas for dissipating heat. Other structures for the heatsinks are also possible. In some embodiments, a heatsink can comprise a wall, such as a wall of the base 12. In some embodiments, a heatsink is integrally formed with or attached to the base 12.

FIGS. 3 and 4 are cross-sectional views of a portion of the robotic system 10. These figures illustrate an example multi-path cooling arrangement that includes paths to the first heatsink 32 and the second heatsink 34. In the illustrated example, the multi-path cooling arrangement is configured to dissipate heat from one or more amplifiers 44 positioned within the base 12. As mentioned above, the amplifiers 44 may be configured to drive one or more motors associated with rotation of the first rotational joint 20, the second rotational joint 22, and/or the end effector 18. It will be appreciated that the multi-path cooling system may also be used to dissipate heat from other heat generating components, such as processors or controllers, for example.

As shown in FIGS. 3 and 4, the amplifiers 44 can be mounted on a bracket 46. The amplifiers 44 can be mounted on the bracket 46 in a manner that allows thermal communication between the bracket 46 and the amplifiers 44. For example, in some embodiments, the amplifiers 44 are in direct physical contact with the bracket 46 such that heat generated by the amplifiers 44 can be directly conducted to the bracket 46. The bracket 46 may comprise a thermally conductive material, such as aluminum, although other thermally conductive materials may also be used. In some embodiments, the bracket 46 may be configured in size and shape so as to provide an effective conductive pathway. For example, the bracket may comprise a thickness of at least 2 mm, at least 3 mm, at least 4 mm, at least 5 mm, at least 6 mm, at least 7 mm, at least 8 mm, at least 9 mm, at least 10 mm, or thicker such that it can adequately dissipate heat from the amplifiers 44 through conduction. In one example, the bracket is approximately 6.3 mm thick.

As illustrated in FIGS. 3 and 4, the bracket 46 may comprise a base plate 48, a first flange 50, and a second flange 52. In the illustrated embodiment, the base plate 48 extends along the bottom of the base 12 in a horizontal direction, for example, generally parallel to a support surface (such as the ground) on which the base 12 is placed. The amplifiers 44 can be mounted on the base plate 48 between the first flange 50 and the second flange 52. The first flange 50 can be positioned on a first side of the base plate 48. The first flange 50 can extend from the base plate 48 at an angle. In the illustrated embodiment, the angle of the first flange 50 relative to the base plate 48 is about 90 degrees, although this need not be the case in all embodiments (e.g., the angle of the first flange can be less than or greater than 90 degrees depending on the application). The second flange 52 can be positioned on a second side of the base plate 48. In some embodiments, the second side of the base plate 48 is opposite the first side of the base plate 48 such that the first flange 50 and the second flange 52 are on opposite sides or ends of the base plate 48. The second flange 52 can extend from the base plate 48 at an angle. In the illustrated embodiment, the angle of the second flange 52 relative to the base plate 48 is about 90 degrees, although this need not be the case in all embodiments. In some embodiments, one or both of the first flange 50 and the second flange 52 can be the same thickness as the base plate 48. In some embodiments, one or both of the first flange 50 and the second flange 52 can be slightly thinner than the base plate 48. For example, in an embodiment where the base plate 48 is about 6.3 mm thick, one or both of the first flange 50 and the second flange 52 can be about 5.3 mm thick. This can be because the bracket 46 can be machined in these areas. Machining one or both of the first flange 50 and the second flange 52 can ensure contact between the flanges and the base 12, which as described below can provide thermal communication therebetween.

The first flange 50 can be attached to the rear side or portion 32 of the base 12, as shown in FIGS. 3 and 4. In some embodiments, the first flange 50 is attached to the rear side or portion 32 of the base 12 with one or more mechanical fasteners 54 as shown. Additionally or alternatively, the first flange 50 can be bonded, welded, or integrally formed with the rear side or portion 32 of the base 12. Accordingly, the first flange 50 can be in contact with the rear side or portion 32 of the base 12 so as to allow thermal conduction between the two. As described above with reference to FIGS. 1 and 2, the first heatsink 28 can be included on the rear side or portion 32 of the base 12. Thus, the first flange 50 can be in thermal communication with the first heatsink 28.

The second flange 52 of the bracket 46 can be positioned so as to contact the front side or portion 34 of the base 12, as shown in FIGS. 3 and 4. In some embodiments, the second flange 52 can include a thermal pad 56 positioned on a face thereof that contacts the contact the front side or portion 34 of the base 12. The thermal pad 56 can be configured to improve or maximize conduction from the second flange 52 to the front side or portion 34 of the base 12. For example, the thermal pad 56 can fill any gaps between the second flange 52 and the base 12 so as to facilitate or ensure direct contact therebetween. The thermal pad 56 can be adhesively attached to the face of the second flange 52, or can be attached in other ways. In some embodiments, the thermal pad 56 is compliant such that it can be pressed between the second flange 52 and the front side or portion 34 of the base 12 to ensure or facilitate contact between the two. The thermal pad 56 may comprise a thermally conductive material. In some embodiments, the thermal pad is about 1 mm, about 2 mm, about 3 mm, about 4 mm, about 5 mm, about 6 mm, about 7 mm, about 8 mm or thicker. In one example, the thermal pad 56 is about 3.2 mm thick. As described above with reference to FIGS. 1 and 2, the second heatsink 30 can be included on the front side or portion 34 of the base 12. Thus, the second flange 52 can be in thermal communication with the second heatsink 30 through the thermal pad 56. In some embodiments, the thermal pad 56 can be omitted and the second flange 52 can directly contact the front side or portion 34 of the base 12. In some embodiments, the thermal pad 56 is attached to the inner surface of the front side or portion 34 rather than to the second flange 52.

Figure 5:
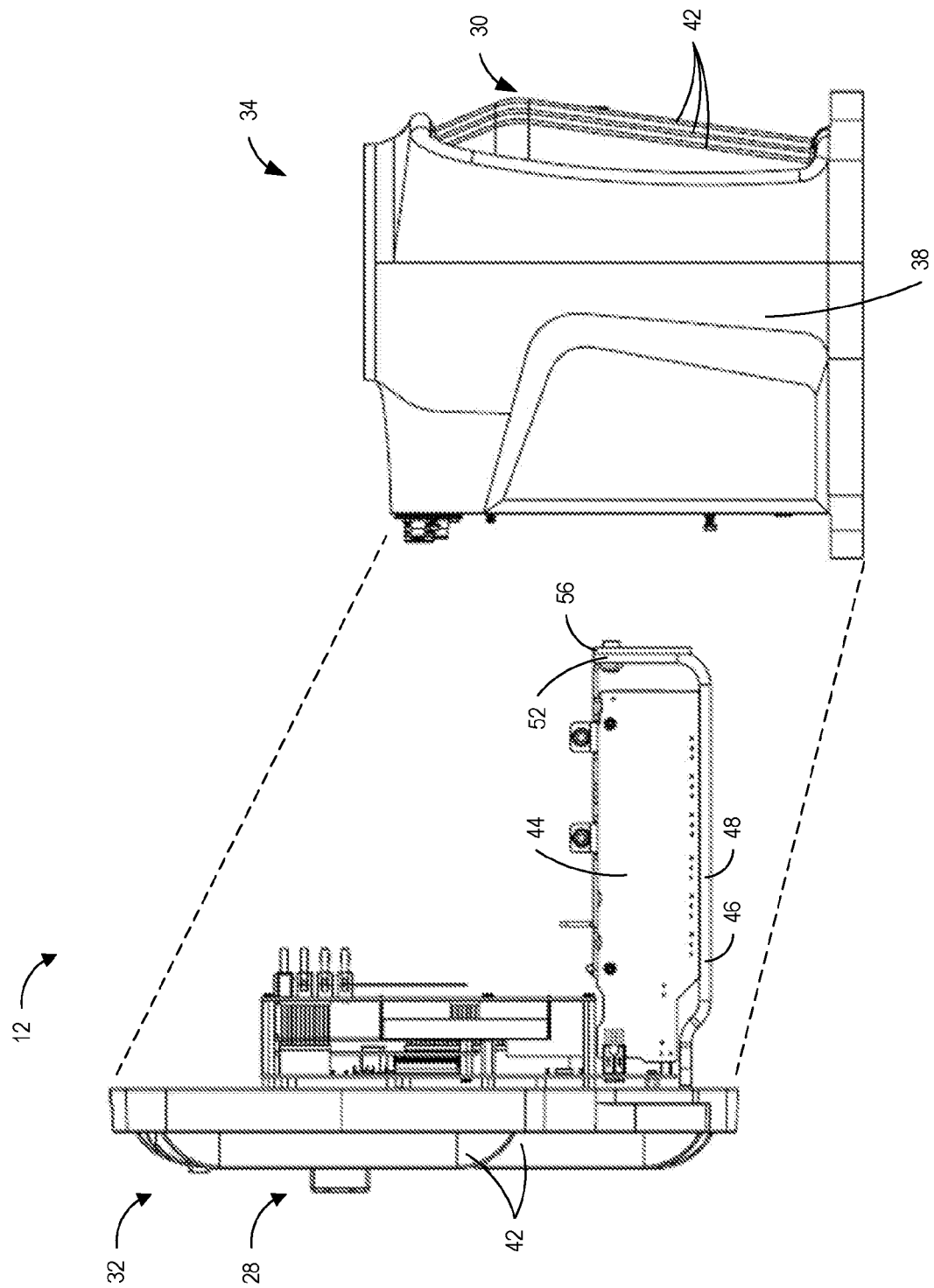
FIG. 5 is a side view of a base of the robotic arm of FIG. 1 and illustrates a rear portion of the base removed from a front portion of the base.

In the illustrated embodiment, the second flange 52 of the bracket 46 is not attached to the front side or portion 34 of the base 12. This may allow the base 12 to be configured such that the rear side or portion 32 is removable from the front side or portion 34 of the base 12 as shown in FIG. 5, which is described below. In other embodiments, the second flange 52 of the bracket 46 may be attached to the front side or portion 34 of the base 12 similar to how the first flange 50 of the bracket 46 is attached the rear side or portion 32 of the base 12.

With reference to FIGS. 3 and 4, the multi-path cooling arrangement thus includes at least two thermal paths for dissipating heat from the amplifiers 44. These paths are illustrated with dotted lines in the figures. A first thermal path 58 allows heat to be conducted from the amplifiers 44 into the base plate 48 of the bracket 46. The heat is conducted through the bracket 46 to the first flange 50 and into the rear side or portion 32 where it can be dissipated by the first heatsink 28. A second thermal path 60 allows heat to be conducted from the amplifiers 44 into the base plate of the bracket 46. The heat is then conducted through the bracket 46 to the second flange 52 and into the front side or portion 34 where it can be dissipated by the second heatsink 30. Such a multi-path cooling arrangement may advantageously improve heat dissipation for the amplifiers 44.

In some embodiments, the multi-path cooling arrangement may provide other or additional benefits as well. For example, as shown in FIG. 4, the amplifiers 44 extend generally along a longitudinal axis 62. The amplifiers 44 may generally comprise a length (measured along the longitudinal axis 62) that is longer than their width (measured transverse to the longitudinal axis 62). In some embodiments, to minimize the overall size of the base 12 it may be beneficial to arrange the amplifiers as shown in FIG. 4, such that the longitudinal axis 62 extends in a generally horizontal direction. While this arrangement may minimize the overall size of the base 12, it may not be advantageous from a thermal perspective. However, the multi-path cooling arrangements described herein can be allow the amplifiers to be arranged such that the longitudinal axis 62 extends in a generally horizontal direction while still providing sufficient heat dissipation.

FIG. 5 is a side view of a base 12 of the robotic system 10 of FIG. 1 and illustrates that, in some embodiments, the rear side or portion 32 of the base 12 can be removed from the front side or portion 34 of the base 12. This can be done to allow access to the interior of the base 12 for, for example, assembly, maintenance, repairs, etc. As illustrated in FIG. 5, when the rear side or portion 32 of the base 12 is removed from the front side or portion 34 of the base 12, the bracket 46 and amplifiers 44 mounted thereto can be removed as well. This may be because, as described above, the bracket 46 is attached to the rear side or portion 32 as described above. For example, as shown in FIGS. 3 and 4, the first flange 50 of the bracket 46 can be attached to the rear side or portion 32. Thus, when the rear side or portion 32 is removed, the bracket 46 and amplifiers 44 can be removed as well.

Further, the bracket 46 can be removed with the rear side or portion 32 because the bracket 46 may not, in some embodiments, be attached to the front side or portion 34. Rather, as described above with reference to FIGS. 3 and 4, the bracket 46 only contacts the front side or portion 34 without being attached thereto. For example, as described above, the second flange 52 of the bracket 46 is in contact with the front side or portion 34 through the thermal pad 56 when assembled. Thus, the bracket 46 and amplifiers 44 can easily be removed from the front side or portion 34 as shown in FIG. 5.

Additionally, the rear side or portion 34 can be brought back together with the front side or portion 34 to form the base 12 as an enclosure (as shown, for example, in FIGS. 1 and 2). As discussed above, in this assembled position, the second flange 52 of the bracket 46 contacts the front side or portion 34 through the thermal pad 56 to establish the second thermal path to the second heatsink 30 on the front side or portion 34. The thermal pad 56 may ensure or facilitate strong thermal contact between the second flange 52 and the front side or portion 34. The first and/or second flanges 50, 52 of the bracket 46 can be configured in size and shape to provide sufficient contact between the flanges 50, 52 and the corresponding portions 32, 34 of the base 12 so as to provide an effective thermally conductive path. For example, in some embodiments, one or both of the flanges 50, 52 are configured with a surface area of at least 2 square inches, at least 3 square inches, at least 4 square inches, at least 5 square inches, or more so as to provide sufficient contact between the flanges 50, 52 and the base 12 to conduct heat. In one example, the first and/or second flange has a contact surface are of about 4 inches with the base 12.

Figure 6:
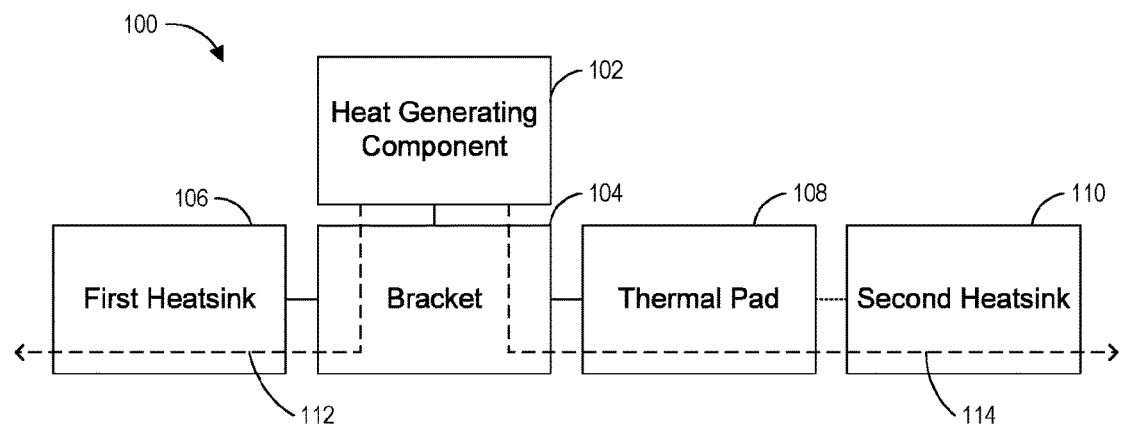
FIG. 6 is a block diagram illustrating a system including a multi-path cooling arrangement according to one embodiment.

FIG. 6 is a block diagram illustrating a system 100 including a multi-path cooling arrangement according to one embodiment. In this example, the system 100 includes a heat generating component 102, a bracket 104, a first heatsink 106, a thermal pad 108, and a second heatsink 110 arranged so as to provide a first thermal path 112 and a second thermal path 114. In some embodiments, the system 100 is a robotic system, such as a robotic arm.

The heat generating component 102 can be any component which generates heat. The system 100 can be configured to dissipate the heat generated by the heat generating component 102 along the first thermal path 112 and the second thermal path 114. In some embodiments, the heat generating component is an amplifier (e.g., amplifier 44 described above), although this need not be the case in all embodiments. The heat generating component 102 could be a processor, an integrated circuit, a motor control, a motor, a data storage device, and/or a memory, among many others.

As shown in FIG. 6, the heat generating component 102 can be mounted on a bracket 104 or other thermally conductive structure configured to support the heat generating component 102. The bracket 104 can be arranged so that heat generated by the heat generating component 102 is communicated to the bracket 104. The heat can be communicated into the bracket 104 by conduction, for example. The heat generating component 102 can be in physical contact with the bracket 104, either directly or indirectly through another structure (such as, e.g., a thermal pad, thermal paste, an additional thermally conductive bracket, etc.). The bracket 104 can comprise a thermally conductive material, such as aluminum, silicon carbide, tungsten, and/or others.

The bracket 104 can be attached, either directly or indirectly to a first heatsink 106 as shown in FIG. 6. In some embodiments, the bracket 104 is attached to the first heatsink 106 with mechanical fasteners, although other joining methods are also possible. The first heatsink 106 can be positioned on (or be part of) a base, enclosure, or other structure. As shown, a first thermal path 112 is formed from the heat generating component 102, through the bracket 104, and to the first heatsink 106.

As shown in FIG. 6, a thermal pad 108 can be attached to the bracket 104. The thermal pad 108 can comprise a thermally conductive material. The thermal pad 108 and bracket 104 can be arranged so as to contact a second heatsink 110. In some embodiments, the bracket 104 is not attached to the second heatsink 110. Accordingly, in FIG. 6, a dashed line has been used between the thermal pad 108 and the second heatsink 110 to indicate that these features may, in some embodiments, be in contact with each other, while not mechanically connected to each other. The second heatsink 110 can be positioned on (or be part of) a base, enclosure, or other structure. As shown, a second thermal path 114 is formed from the heat generating component 102, through the bracket 104 and thermal pad 108, and to the second heatsink 110. In some embodiments, the thermal pad 108 may be omitted and the bracket 104 may contact the second heatsink 110 directly.

Accordingly, the system 100 includes a multi-path cooling arrangement that includes the first thermal path 112 and the second thermal path 114 for dissipating heat from the heat generating component 102 to the first heatsink 106 and the second heatsink 110, respectively.

Figure 7:
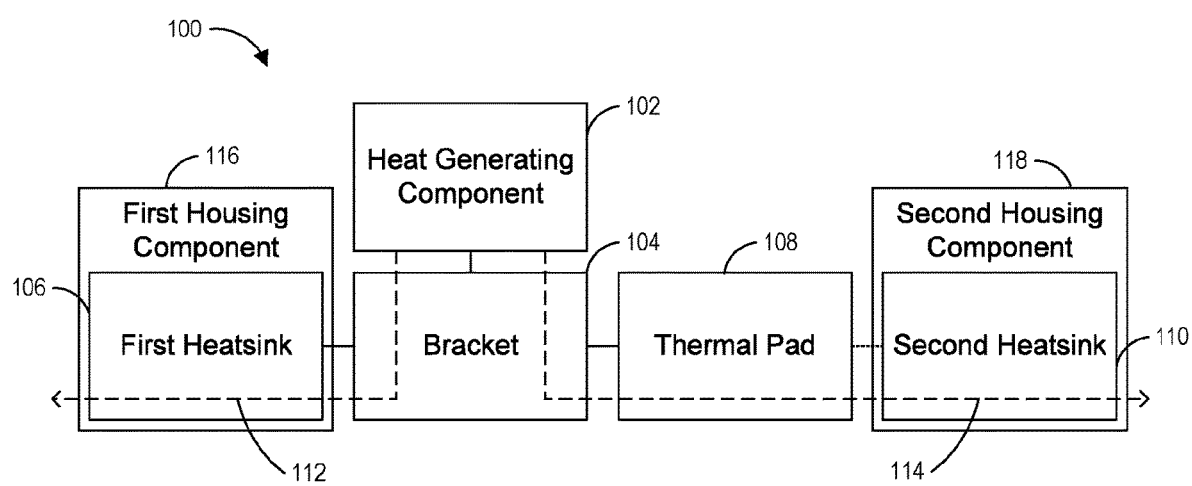
FIG. 7 is a block diagram illustrating a system including a multi-path cooling arrangement and a multi-component housing according to one embodiment.

FIG. 7 is a block diagram illustrating another embodiment of the system 100. In this embodiment, the first heatsink 106 is positioned on a first housing component 116 and the second heatsink 110 is positioned on a second housing component 118. The first and second housing components 116, 118 can be configured to form an enclosure that partially or fully encloses the heat generating component. The first and second housing components 116, 118 can be detached from each other to allow access to the interior of the enclosure. As shown in FIG. 7, the bracket 104 can be attached to the first heat sink 106, which is formed on the first housing component 116. Thus, when the first housing component 116 is removed from the second housing component 118, the bracket 104 and heat generating component 102 can be removed with it. When the first housing component 116 is reattached to the second housing component 118, the bracket 104 may contact the second heat sink 110 through the thermal pad 108. As shown, the first thermal path 112 is formed from the heat generating component 102, through the bracket 104, and to the first heatsink 106 on the first housing component 116. Also, the second thermal path 114 is formed from the heat generating component 102, through the bracket 104 and thermal pad 108, and to the second heatsink 110 on the second housing component 118.

Figure 8:
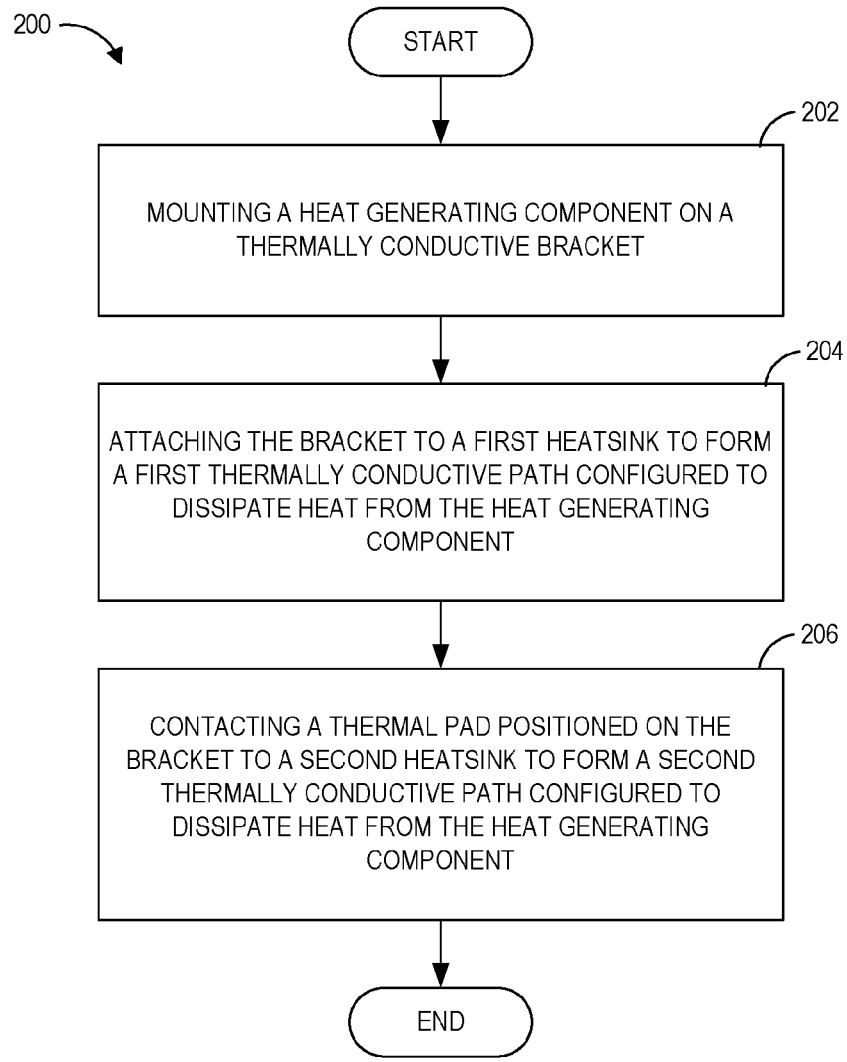
FIG. 8 is a flowchart illustrating a method for dissipating heat in a robotic system according to one embodiment.

FIG. 8 is a flowchart illustrating a method 200 for dissipating heat in a robotic system according to one embodiment. As illustrated, the method begins at block 202, at which a heat generating component is mounted on a thermally conductive bracket. In some embodiments, the bracket is positioned with a base of a robotic system, such as a robotic arm. The heat generating component can be mounted on the bracket such that heat generated by the heat generating component is conducted into the bracket. In some embodiments, the heat generating component is an amplifier as described above, although the method 200 is useful with other types of heat generating components as well. In some embodiments, is mounted on the bracket such that a longitudinal axis of the heat generating component extends in a generally horizontal direction.

The method 200 then moves to block 204. At block 204, the bracket is attached to a first heatsink to form a first thermally conductive path configured to dissipate heat from the heat generating component. In some embodiments, the heatsink is positioned on a first side of the base. In some embodiments, the heatsink comprises one or more fins configured to dissipate heat. In some embodiments, the bracket is mechanically fastened to the first heatsink. Other joining methods may also be used.

Next, at block 206, a thermal pad positioned on the bracket is contacted to a second heatsink to form a second thermally conductive path configured to dissipate heat from the heat generating component. In some embodiments, the heatsink is positioned on a second side of the base. In some embodiments, the heatsink comprises one or more fins configured to dissipate heat. In some embodiments, contacting the thermal pad to the second heatsink comprises attaching a rear portion of the housing to a front portion of the housing. The first heatsink can be positioned on the rear portion of the housing and the bracket can be connected to the rear portion of the housing. The second heatsink can be disposed on the front portion of the housing.

The foregoing description details certain embodiments of the systems, devices, and methods disclosed herein. It will be appreciated, however, that no matter how detailed the foregoing appears in text, the systems, devices, and methods can be practiced in many ways. As is also stated above, it should be noted that the use of particular terminology when describing certain features or aspects of the disclosure should not be taken to imply that the terminology is being re-defined herein to be restricted to including any specific characteristics of the features or aspects of the technology with which that terminology is associated.

It will be appreciated by those skilled in the art that various modifications and changes can be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures can be combined, interchanged or excluded from other embodiments.

With respect to the use of substantially any plural and/or singular terms herein, those having skill in the art can translate from the plural to the singular and/or from the singular to the plural as is appropriate to the context and/or application. The various singular/plural permutations can be expressly set forth herein for sake of clarity.

Directional terms used herein (e.g., top, bottom, side, up, down, inward, outward, etc.) are generally used with reference to the orientation shown in the figures and are not intended to be limiting. For example, the top surface described above can refer to a bottom surface or a side surface. Thus, features described on the top surface may be included on a bottom surface, a side surface, or any other surface.

It will be understood by those within the art that, in general, terms used herein are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims can contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The term "comprising" as used herein is synonymous with "including," "containing," or "characterized by," and is inclusive or open-ended and does not exclude additional, unrecited elements or method steps.

The above description discloses several methods and materials of the present invention(s). This invention(s) is susceptible to modifications in the methods and materials, as well as alterations in the fabrication methods and equipment. Such modifications will become apparent to those skilled in the art from a consideration of this disclosure or practice of the invention(s) disclosed herein. Consequently, it is not intended that this invention(s) be limited to the specific embodiments disclosed herein, but that it cover all modifications and alternatives coming within the true scope and spirit of the invention(s) as embodied in the attached claims.

What is claimed is:

1. A robotic system, comprising:
   a base supporting one or more articulating links, the base comprising:
   a front portion comprising a front wall;
   a rear portion removably attached to the front portion and comprising a back wall;
   a bracket supporting a heat generating component, a first side of the bracket attached to the back wall of the rear portion of the base to form a first thermally conductive path that, in use, dissipates heat from the heat generating component; and
   a thermal pad attached to a second side of the bracket, the thermal pad contacting the front wall of the base to form a second thermally conductive path that, in use, dissipates heat from the heat generating component.

2. The system of claim 1, wherein the heat generating component comprises an amplifier.

3. The system of claim 2, wherein the amplifier is mounted on the bracket such that a longitudinal axis of the amplifier extends in a substantially horizontal direction.

4. The system of claim 1, wherein at least one of the front wall of the front portion and the back wall of the rear portion comprises one or more fins configured to dissipate heat.

5. The system of claim 1, wherein an integrated controller is positioned within the base and in thermal contact with a heat sink positioned on one of the front portion and the rear portion of the base.

6. The system of claim 1, wherein the bracket comprises:
   a first flange connected to the back wall of the rear portion;
   a second flange, wherein the thermal pad is positioned on an outer surface of the second flange so as to contact the front wall of the front portion; and
   a plate extending between the first flange and the second flange, wherein the heat generating component is mounted to the plate.

7. The system of claim 6, wherein the first flange and the second flange extend in a substantially vertical direction, and the plate extends in a substantially horizontal direction.

8. A robotic system, comprising:
   a heat generating component positioned within a base that supports one or more articulating links;
   a bracket supporting the heat generating component, wherein the heat generating component is mounted on and directly contacts the bracket, wherein the bracket is thermally conductive;
   a first thermally conductive path configured to dissipate heat from the heat generating component, the first thermally conductive path comprising the bracket and a first heatsink connected to the bracket, wherein the first heatsink is positioned on a first side of the base; and
   a second thermally conductive path configured to dissipate heat from the heat generating component, the second thermally conductive path comprising the bracket, a thermal pad positioned on the bracket, and a second heatsink positioned on a second side of the base, wherein the thermal pad is in thermal communication with the second heatsink.

9. The system of claim 8, wherein the heat generating component comprises an amplifier.

10. The system of claim 9, wherein the amplifier is mounted on the bracket such that a longitudinal axis of the amplifier extends in a horizontal direction.

11. The system of claim 8, wherein:
    the first heatsink is disposed on a first wall of the base; and
    the second heatsink is disposed on a second wall of the base, wherein the first and second wall are positioned on substantially opposite sides of the base.

12. The system of claim 8, wherein the bracket comprises:
    a first flange connected to the first heatsink;
    a second flange, wherein the thermal pad is positioned on an outer surface of the second flange so as to contact the second heatsink; and
    a plate extending between the first flange and the second flange, wherein the heat generating component is mounted to the plate.

13. The system of claim 12, wherein the first flange and the second flange extend in a substantially vertical direction, and the plate extends in a substantially horizontal direction.

14. A method for dissipating heat in a robotic system, the method comprising:
    mounting a heat generating component on a bracket within a base of a robotic arm, the bracket being thermally conductive;
    attaching the bracket to a first heatsink positioned on a first side of the base to form a first thermally conductive path configured to dissipate heat from the heat generating component; and
    contacting a thermal pad positioned on the bracket to a second side of the base to form a second thermally conductive path configured to dissipate heat from the heat generating component to a second heatsink positioned on the second side of the base.

15. The method of claim 14, wherein contacting the thermal pad comprises attaching a rear portion of the housing to a front portion of the housing, wherein the first heatsink is disposed on the rear portion of the housing and the bracket is connected to the rear portion of the housing, and wherein the second heatsink is disposed on the front portion of the housing.

16. The method of claim 14, wherein the heat generating component comprises an amplifier, and wherein mounting the heat generating component on the bracket comprises mounting the amplifier on the bracket such that a longitudinal axis of the amplifier extends in a generally horizontal direction.

17. The method of claim 14, wherein the first heatsink comprises one of more fins formed on the first side of the base.

18. The method of claim 14, wherein the second heatsink comprises one of more fins formed on the second side of the base.

* * * * *

UNITED STATES PATENT AND TRADEMARK OFFICE
CERTIFICATE OF CORRECTION

PATENT NO. : 11,766,787 B2
APPLICATION NO. : 17/435799
DATED : September 26, 2023
INVENTOR(S) : Daniel P. Norboe Page 1 of 1

It is certified that error appears in the above-identified patent and that said Letters Patent is hereby corrected as shown below:

In the Claims

In Column 14, Claim 17, Line 54 (Approx.), delete "one of more" and insert --one or more--.

In Column 14, Claim 18, Line 57 (Approx.), delete "one of more" and insert --one or more--.

Signed and Sealed this
Fifth Day of December, 2023

Katherine Kelly Vidal
*Director of the United States Patent and Trademark Office*